(12) United States Patent
Lee et al.

(10) Patent No.: US 11,796,599 B2
(45) Date of Patent: Oct. 24, 2023

(54) BATTERY DIAGNOSIS APPARATUS, BATTERY DIAGNOSIS METHOD AND ENERGY STORAGE SYSTEM

(71) Applicant: LG ENERGY SOLUTION, LTD., Seoul (KR)

(72) Inventors: Hyun-Chul Lee, Daejeon (KR); Dong-Keun Kwon, Daejeon (KR); Seung-Hyun Kim, Daejeon (KR); An-Soo Kim, Daejeon (KR); Sung-Yul Yoon, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 160 days.

(21) Appl. No.: 17/440,357

(22) PCT Filed: Sep. 28, 2020

(86) PCT No.: PCT/KR2020/013277
§ 371 (c)(1),
(2) Date: Sep. 17, 2021

(87) PCT Pub. No.: WO2021/091086
PCT Pub. Date: May 14, 2021

(65) Prior Publication Data
US 2022/0196752 A1 Jun. 23, 2022

(30) Foreign Application Priority Data
Nov. 5, 2019 (KR) .......... 10-2019-0140356

(51) Int. Cl.
G01R 31/3835 (2019.01)
G01R 31/396 (2019.01)
(Continued)

(52) U.S. Cl.
CPC ..... *G01R 31/3835* (2019.01); *G01R 31/3648* (2013.01); *G01R 31/396* (2019.01); *H01M 10/48* (2013.01)

(58) Field of Classification Search
CPC .......... G01R 31/3835; G01R 31/396
(Continued)

(56) References Cited

U.S. PATENT DOCUMENTS

2009/0256524 A1 10/2009 Nukui
2012/0062238 A1 3/2012 Kawasaki et al.
(Continued)

FOREIGN PATENT DOCUMENTS

CN 107860975 A 3/2018
JP 9-15311 A 1/1997
(Continued)

OTHER PUBLICATIONS

International Search Report (PCT/ISA/210) issued in PCT/KR2020/013277 dated Jan. 27, 2021.
(Continued)

*Primary Examiner* — Ricky Go
(74) *Attorney, Agent, or Firm* — Birch, Stewart, Kolasch & Birch, LLP

(57) ABSTRACT

A battery diagnosis apparatus according to the present disclosure includes a voltage measurer for measuring a cell voltage of each of first to $n^{th}$ battery cells and a processor, wherein n is a natural number of 2 or greater. The processor determines an average cell voltage of each battery cell for a first rest period from a first time point to a second time point, based on the cell voltage of each battery cell measured a first number of times for the first rest period, determines an average cell voltage of each battery cell for a second rest period and diagnoses a fault of each battery cell based on the average cell voltage of each battery cell for the first rest
(Continued)

period and the average cell voltage of each battery cell for the second rest period.

14 Claims, 5 Drawing Sheets

(51) Int. Cl.
 *G01R 31/36* (2020.01)
 *H01M 10/48* (2006.01)
(58) Field of Classification Search
 USPC .......................................................... 702/63
 See application file for complete search history.

(56) References Cited

U.S. PATENT DOCUMENTS

| | | | |
|---|---|---|---|
| 2013/0311118 | A1 | 11/2013 | Sejima |
| 2019/0077265 | A1 | 3/2019 | Ono et al. |
| 2019/0312318 | A1* | 10/2019 | Myers ................. H01M 10/486 |
| 2020/0088800 | A1* | 3/2020 | Hess .................... G01R 31/389 |
| 2020/0249279 | A1* | 8/2020 | Cornelli ............... G01R 31/367 |
| 2020/0391610 | A1* | 12/2020 | Park ................... G01R 31/3835 |
| 2021/0132156 | A1 | 5/2021 | Weidner et al. |

FOREIGN PATENT DOCUMENTS

| | | |
|---|---|---|
| JP | 2004-247319 A | 9/2004 |
| JP | 2007-46942 A | 2/2007 |
| JP | 2007-178333 A | 7/2007 |
| JP | 2009-257784 A | 11/2009 |
| JP | 2011-54413 A | 3/2011 |
| JP | 2019-179029 A | 3/2011 |
| JP | 2011-128010 A | 6/2011 |
| JP | 2013-160582 A | 8/2013 |
| JP | 2013-238564 A | 11/2013 |
| JP | WO2017/130258 A1 | 8/2017 |
| JP | 2018-92790 A | 6/2018 |
| JP | 2019-126108 A | 7/2019 |
| JP | 2019-158831 A | 9/2019 |
| KR | 10-0974765 B1 | 8/2010 |
| KR | 10-1273727 B1 | 6/2013 |
| KR | 10-1660883 B1 | 9/2016 |

OTHER PUBLICATIONS

Extended European Search Report ('EESR') Application No. 20884925.7 dated Jun. 30, 2022.

* cited by examiner

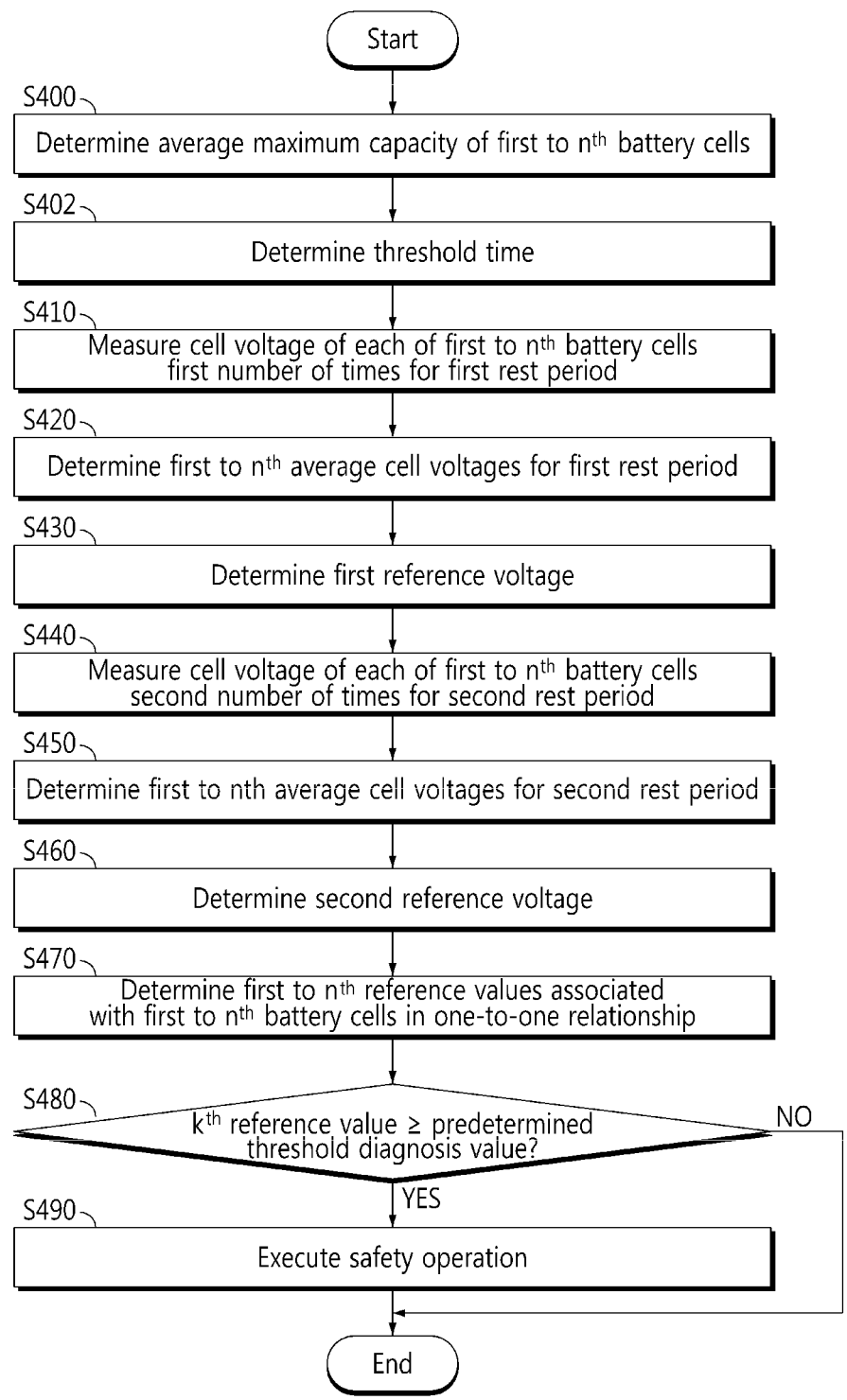

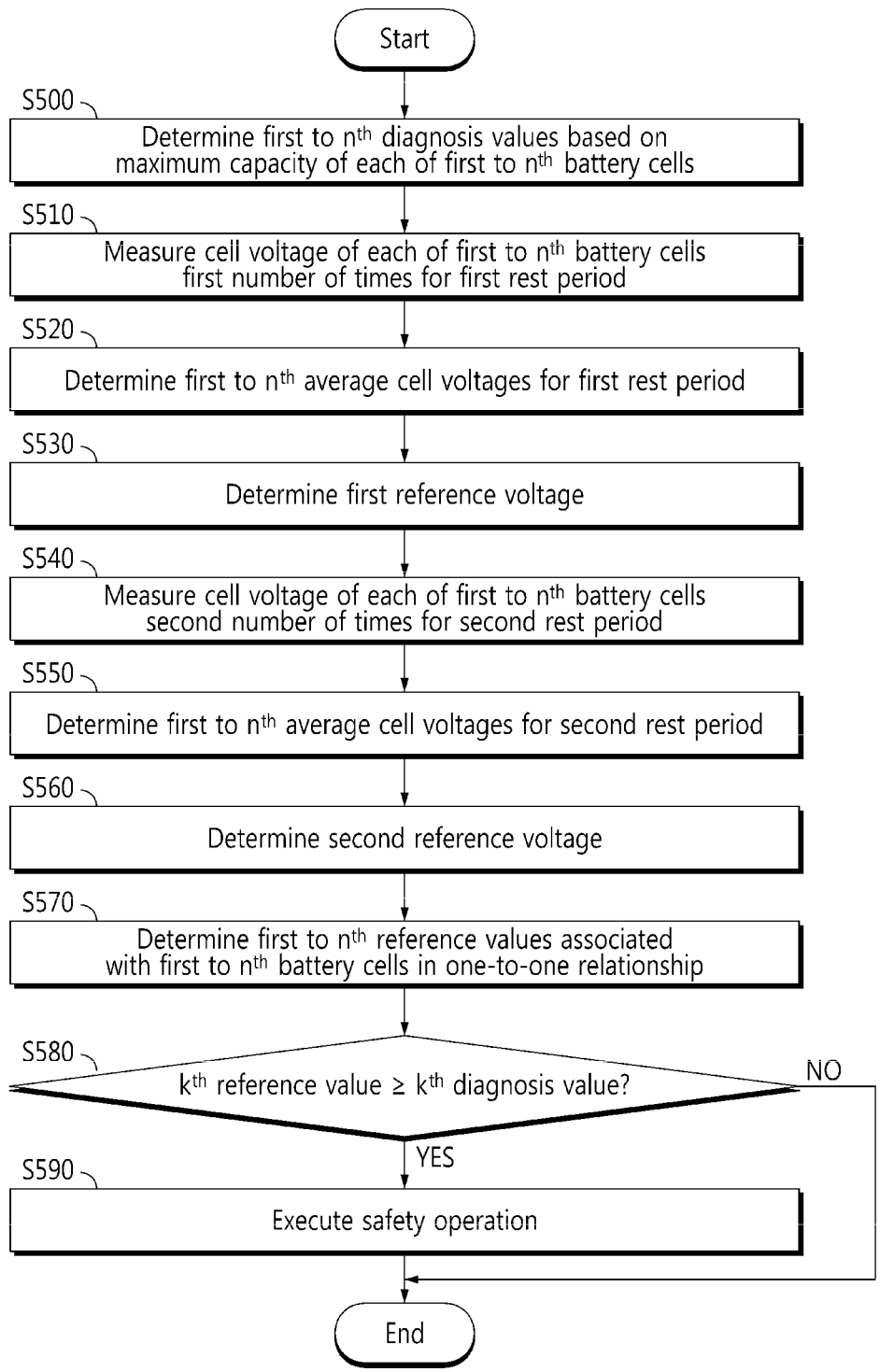

BATTERY DIAGNOSIS APPARATUS, BATTERY DIAGNOSIS METHOD AND ENERGY STORAGE SYSTEM

TECHNICAL FIELD

The present disclosure relates to technology for diagnosing a fault of a battery cell from a voltage change of the battery cell in a rest state of the battery cell.

The present application claims priority to Korean Patent Application No. 10-2019-0140356 filed in the Republic of Korea on Nov. 5, 2019, the disclosure of which is incorporated herein by reference.

BACKGROUND ART

Recently, there has been a dramatic increase in demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

On the other hand, a cell assembly including a few to a few tens of battery cells electrically connected in series is widely used to generate high voltage. When some battery cells have faults, each faulty battery cell may have an extraordinarily large voltage drop even in the rest state in which charging and discharging is being stopped.

The related art performs cell voltage measurements of each of a plurality of battery cells at a specific time point, and fault diagnosis of each battery cell from a difference between each cell voltage and the average cell voltage. However, since the cell voltage relies on a defect in the battery cell itself as well as the state of charge and the level of degradation, the related art based on the cell voltage measured once at the specific time point has a high diagnosis error. For example, a normal battery cell may be misdiagnosed as a faulty battery cell or a faulty battery cell may be misdiagnosed as a normal battery cell.

DISCLOSURE

Technical Problem

The present disclosure is designed to solve the above-described problem, and therefore the present disclosure is directed to providing an apparatus and method for diagnosing a fault of each of a plurality of battery cells connected in series and/or in parallel from voltage changes of each battery cell in the rest state, and an energy storage system comprising the apparatus.

These and other objects and advantages of the present disclosure may be understood by the following description and will be apparent from the embodiments of the present disclosure. In addition, it will be easily understood that the objects and advantages of the present disclosure may be realized by the means set forth in the appended claims and a combination thereof.

Technical Solution

A battery diagnosis apparatus according to an aspect of the present disclosure includes a voltage measurer configured to measure a cell voltage of each of first to $n^{th}$ battery cells, and a processor operably coupled to the voltage measurer, wherein n is a natural number of 2 or greater. The processor is configured to determine first to $n^{th}$ average cell voltages for a first rest period associated with the first to $n^{th}$ battery cells in a one-to-one relationship, based on the cell voltage of each battery cell measured a first number of times for the first rest period, wherein the first rest period is from a first time point to a second time point. The processor is configured to determine first to $n^{th}$ average cell voltages for a second rest period associated with the first to $n^{th}$ battery cells in a one-to-one relationship, based on the cell voltage of each battery cell measured a second number of times for the second rest period, wherein the second rest period is from a third time point to a fourth time point. The third time point is later than the second time point, and is a time point at which a threshold time has passed since the first time point. The processor is configured to diagnose a fault of each of the first to $n^{th}$ battery cells based on the first to $n^{th}$ average cell voltages for the first rest period and the first to $n^{th}$ average cell voltages for the second rest period.

The first time point may be a time point at which the first to $n^{th}$ battery cells is changed from a cycle state to a rest state.

The processor may be configured to determine the first to $n^{th}$ average cell voltages for the first rest period using the following Equation 1:

$$V_{k\_1} = \frac{1}{i} \times \sum_{x=1}^{i} V_k[x] \qquad \langle \text{Equation 1} \rangle$$

wherein k is a natural number that is equal to or less than n, i is the first number of times, x is a natural number that is equal to or less than i, $V_k[x]$ is the cell voltage of the $k^{th}$ battery cell measured at the $x^{th}$ time within the first rest period, and $V_{k\_1}$ is the $k^{th}$ average cell voltage for the first rest period.

The processor may be configured to determine the first to $n^{th}$ average cell voltages for the second rest period using the following Equation 2:

$$V_{k\_2} = \frac{1}{j} \times \sum_{y=1}^{j} V_k[y] \qquad \langle \text{Equation 2} \rangle$$

wherein k is a natural number that is equal to or less than n, j is the second number of times, y is a natural number that is equal to or less than j, $V_k[y]$ is the cell voltage of the $k^{th}$ battery cell measured at the $y^{th}$ time within the second rest period, and $V_{k\_2}$ is the $k^{th}$ average cell voltage for the second rest period.

The processor may be configured to determine a first reference voltage based on the first to $n^{th}$ average cell voltages for the first rest period. The processor may be configured to determine a second reference voltage based on the first to $n^{th}$ average cell voltages for the second rest period.

The processor may be configured to determine first to $n^{th}$ reference values associated with the first to $n^{th}$ battery cells in a one-to-one relationship, using the following Equation 3:

$$R_k = \frac{V_{k\_1} - V_{k\_2}}{V_{ref\_1} - V_{ref\_2}} \qquad \langle \text{Equation 3} \rangle$$

wherein k is a natural number that is equal to or less than n, $V_{ref\_1}$ is the first reference voltage, $V_{ref\_2}$ is the second reference voltage, and $R_k$ is the $k^{th}$ reference value.

The processor may be configured to determine first to $n^{th}$ reference values associated with the first to $n^{th}$ battery cells in a one-to-one relationship, using the following Equation 4:

$$R_k = \frac{V_{ref\_2} - V_{k\_2}}{V_{ref\_1} - V_{k\_1}} \qquad \langle \text{Equation 4} \rangle$$

wherein k is a natural number that is equal to or less than n, $V_{ref\_1}$ is the first reference voltage, $V_{ref\_2}$ is the second reference voltage, and $R_k$ is the $k^{th}$ reference value.

The processor may be configured to diagnose that the $k^{th}$ battery cell is faulty when the $k^{th}$ reference value is equal to or larger than a predetermined threshold diagnosis value that is larger than 1.

The processor may be configured to determine first to $n^{th}$ diagnosis values based on the maximum capacity of each of the first to $n^{th}$ battery cells, each diagnosis value being larger than 1. The processor may be configured to diagnose that the $k^{th}$ battery cell is faulty when the $k^{th}$ reference value is equal to or larger than the $k^{th}$ diagnosis value.

The processor may be configured to increase the $k^{th}$ diagnosis value as the maximum capacity of the $k^{th}$ battery cell reduces.

The processor may be configured to determine the threshold time based on an average maximum capacity of the first to $n^{th}$ battery cells.

The processor may be configured to reduce the threshold time as the average maximum capacity reduces.

An energy storage system according to another aspect of the present disclosure includes the battery diagnosis apparatus.

A battery diagnosis method according to still another aspect of the present disclosure is executable by the battery diagnosis apparatus. The battery diagnosis method includes determining first to $n^{th}$ average cell voltages for a first rest period associated with first to $n^{th}$ battery cells in a one-to-one relationship, respectively based on cell voltages of the first to $n^{th}$ battery cells measured a first number of times for the first rest period, wherein the first rest period is from a first time point to a second time point, and n is a natural number of 2 or greater, determining first to $n^{th}$ average cell voltages for a second rest period associated with the first to $n^{th}$ battery cells in a one-to-one relationship, based on a cell voltage of each battery cell measured a second number of times for the second rest period, wherein the second rest period is from a third time point to a fourth time point, and the third time point is later than the second time point, and is a time point at which a threshold time has passed since the first time point, and diagnosing a fault of each of the first to $n^{th}$ battery cells based on the first to $n^{th}$ average cell voltages for the first rest period and the first to $n^{th}$ average cell voltages for the second rest period.

Advantageous Effects

According to at least one of the embodiments of the present disclosure, it is possible to diagnose a fault (for example, an internal short circuit, an external short circuit) of each of a plurality of battery cells connected in series and/or in parallel from voltage changes of each battery cell for the period during which each battery cell is kept at rest.

In addition, according to at least one of the embodiments of the present disclosure, it is possible to improve the diagnosis accuracy and reduce the time required for diagnosis by adjusting the threshold (for example, the threshold time, the diagnosis value as described below) used for fault diagnosis based on the maximum capacity of each battery cell.

The effects of the present disclosure are not limited to the above-mentioned effects, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

FIG. 4 is a flowchart exemplarily showing a battery diagnosis method according to a second embodiment of the present disclosure.

FIG. 5 is a flowchart exemplarily showing a battery diagnosis method according to a third embodiment of the present disclosure.

DETAILED DESCRIPTION

Figure 1:
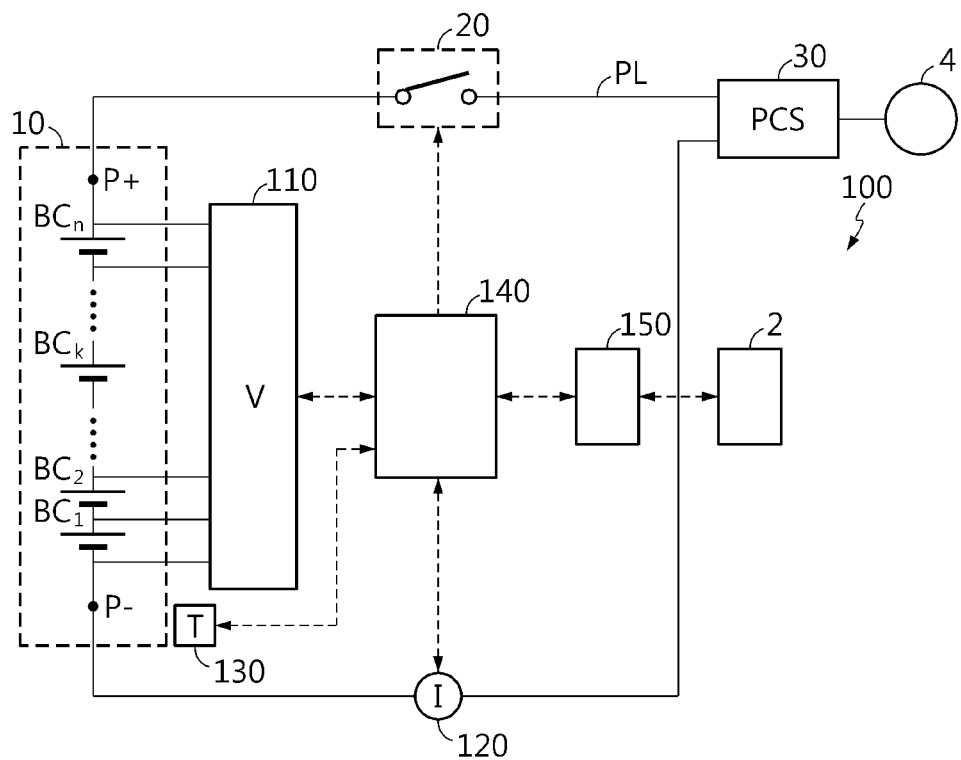
FIG. 1 is a diagram exemplarily showing a configuration of an energy storage system 1 according to the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and may be implemented by hardware or software alone or in combination.

In addition, throughout the specification, it will be further understood that when an element is referred to as being "connected to" another element, it can be directly connected to the other element or intervening elements may be present.

FIG. 1 is a diagram exemplarily showing a configuration of an energy storage system 1 according to the present disclosure.

Referring to FIG. 1, the energy storage system 1 includes a battery pack 10, a switch 20, a high level controller 2, a power conversion system 30 and a battery diagnosis apparatus 100.

The battery pack 10 includes a positive terminal P+, a negative terminal P− and a plurality of battery cells $BC_1$~$BC_n$ (n is a natural number of 2 or greater). The plurality of battery cells $BC_1$~$BC_n$, (n is a natural number of 2 or greater) is electrically connected in series and/or in parallel between the positive terminal P+ and the negative terminal P−. Each battery cell BC may be a lithium ion battery cell. The BC may include any type of battery cell that can be repeatedly recharged and is not limited to a particular type.

The switch 20 is installed on a power line PL for the battery pack 10. While the switch 20 is turned on, power may be transmitted from any one of the battery pack 10 and the power conversion system 30 to the other. The switch 20 may be realized by combining at least one of known switching devices such as a relay and a Field Effect Transistor (FET).

The power conversion system 30 is operably coupled to the battery diagnosis apparatus 100. The power conversion system 30 may generate direct current (DC) power for charging the battery pack 10 from alternating current (AC) power from an electrical grid 4. The power conversion system 30 may generate AC power from DC power from the battery pack 10.

The battery diagnosis apparatus 100 (hereinafter referred to as the 'apparatus') includes a voltage measuring unit 110 and a control unit 140. The apparatus 100 may further include at least one of a current measuring unit 120, a temperature measuring unit 130 or a communication unit 150.

The voltage measuring unit 110 includes at least one voltage sensor provided to be electrically connected to the positive terminal and the negative terminal of each battery cell BC. The voltage measuring unit 110 is configured to measure a cell voltage of each battery cell BC, i.e., a voltage across each battery cell BC, and output a signal indicating the measured cell voltage to the control unit 140.

The current measuring unit 120 is provided to be electrically connected in series to the battery pack 10 through the power line PL. For example, the current measuring unit 120 may include a shunt resistor or a hall effect device. The current measuring unit 120 is configured to measure an electric current flowing through the power line PL, and output a signal indicating the measured current to the control unit 140.

The temperature measuring unit 130 includes at least one temperature sensor disposed within a predetermined distance from the battery pack 10. For example, the temperature sensor may include a thermocouple. The temperature measuring unit 130 is configured to measure the temperature of the battery pack 10, and output a signal indicating the measured temperature to the control unit 140.

The control unit 140 is operably coupled to the switch 20, the voltage measuring unit 110, the current measuring unit 120, the temperature measuring unit 130 and the communication unit 150. The control unit 140 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing other functions.

The control unit 140 may include a memory embedded therein. The memory may store programs and data required for performing battery diagnosis methods according to the following embodiments. The memory may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The communication unit 150 may be coupled to the high level controller 2 of the energy storage system 1 to allow communication between them. The communication unit 150 may transmit a message from the high level controller 2 to the control unit 140, and transmit a message from the control unit 140 to the high level controller 2. The message from the control unit 140 may include information for notifying a fault of each battery cell BC. The communication between the communication unit 150 and the high level controller 2 may be carried out using, for example, wired networks such as local area network (LAN), controller area network (CAN) and daisy chain and/or near-field wireless networks such as Bluetooth, Zigbee and WiFi.

The control unit 140 may determine the State Of Charge (SOC) of each battery cell BC based on the cell voltage, the current and/or the temperature for each battery cell BC. The SOC may be determined using known methods such as ampere counting and Kalman filter.

The control unit 140 may determine the maximum capacity of each battery cell BC from a ratio between an accumulated amount of current and a SOC change for a predetermined period of time, for each battery cell BC. The control unit 140 may determine the maximum capacity of each battery cell BC based on the accumulated amount of current and the SOC change for a recent period during which the SOC change is equal to or larger than a predetermined threshold change (for example, 50%). For example, when k is a natural number that is less than n, in case that the accumulated amount of current and the SOC change of the battery cell $BC_k$ for the last one hour are 50 mAh and 80% respectively, the maximum capacity of the battery cell $BC_k$ may be determined to be (50 mAh/80%)×100%=62.5 mAh.

In the specification, "cycle state" refers to an ON state of the switch 20 to allow charging and discharging of each battery cell BC. In the specification, "rest state" refers to an OFF state of the switch 20 so that no current flows through the power line PL, i.e., the charge and discharge of each battery cell BC is stopped.

Figure 2:
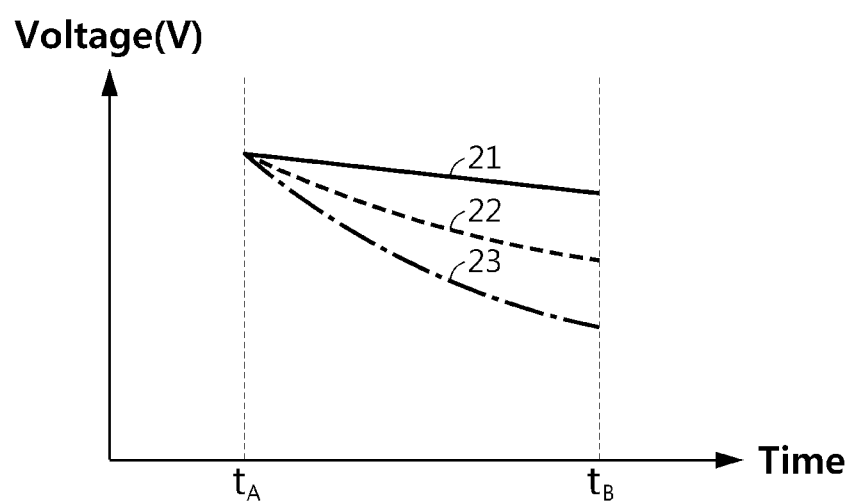
FIG. 2 is a graph exemplarily showing voltage changes of three battery cells kept in a rest state respectively.

FIG. 2 is a graph exemplarily showing voltage changes of three battery cells kept in a rest state respectively.

In FIG. 2, $t_A$ is the start time of the rest state, $t_B$ is the end time of the rest state, and assume that the three battery cells have the same cell voltage at $t_A$. A first curve 21 shows the time-dependent changes in cell voltage of the first battery cell which has the maximum capacity of A (for example, 100 mAh) and is in a normal condition. A second curve 22 shows the time-dependent changes in cell voltage of the second battery cell which has the maximum capacity of A and is in a faulty condition. A third curve 23 shows the time-dependent changes in cell voltage of the third battery cell which has the maximum capacity of B (for example, 85 mAh) lower than A and is in a faulty condition.

When comparing the first curve 21 with the second curve 22, it can be seen that in case that the two battery cells have the same maximum capacity (i.e., the same level of degradation), a voltage drop of the faulty battery cell (for example, an internal short circuit, an external short circuit) is larger than a voltage drop of the normal battery cell over the same period.

When comparing the second curve 22 with the third curve 23, it can be seen that a voltage drop of the battery cell having lower maximum capacity is larger than a voltage drop of the battery cell having higher maximum capacity over the same period.

Hereinafter, the embodiments for diagnosing a faulty of each of the first to $n^{th}$ battery cells $BC_1 \sim BC_n$ will be described in more detail with reference to FIGS. 3 to 5. The battery diagnosis methods according to FIGS. 3 and 4 may be executable by the control unit 140 while the battery pack 10 is kept in the rest state during a first rest period and a second rest period in response to the transition of the battery pack 10 from the cycle state to the rest state as described below.

Figure 3:
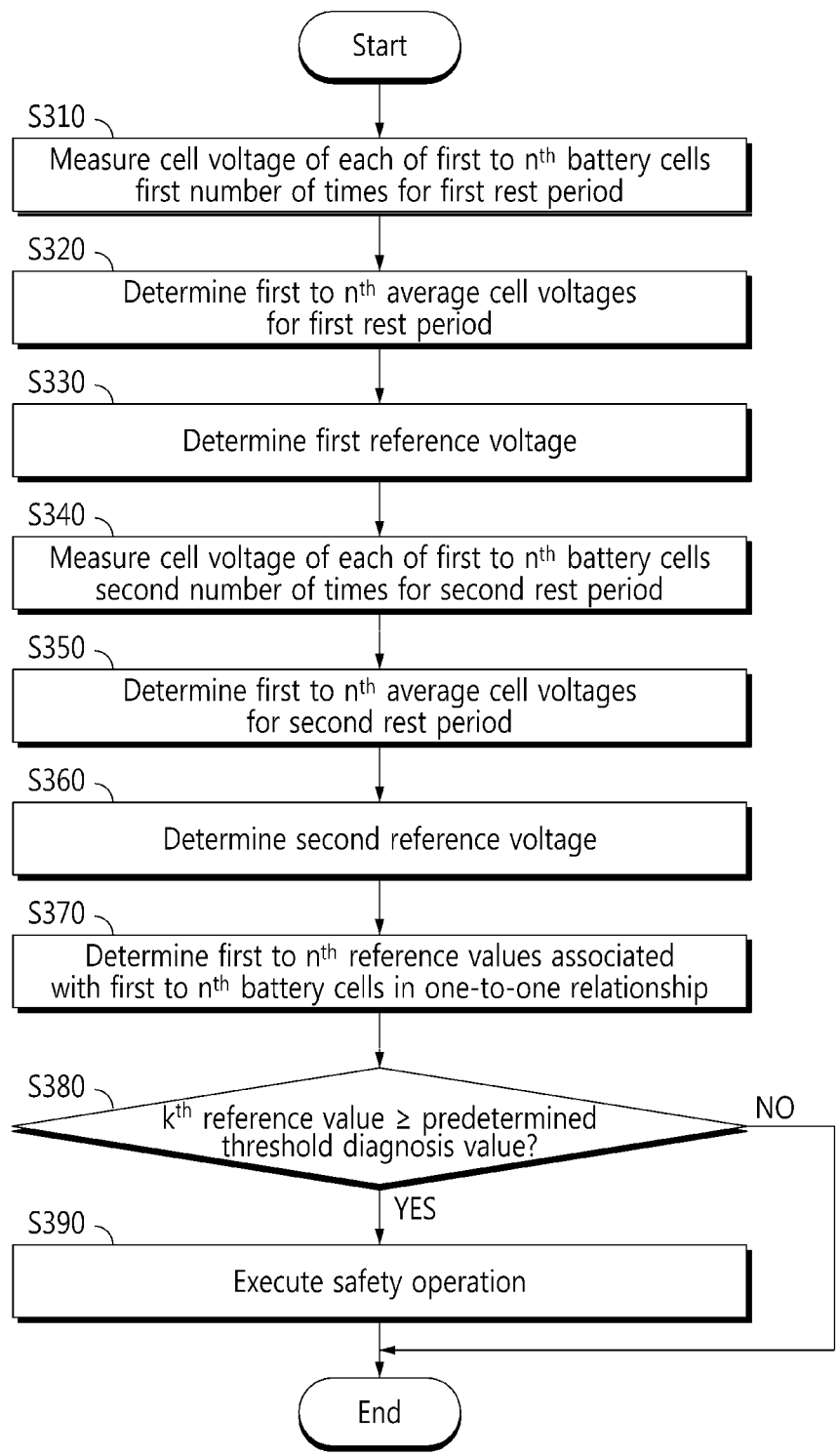
FIG. 3 is a flowchart exemplarily showing a battery diagnosis method according to a first embodiment of the present disclosure.

FIG. 3 is a flowchart exemplarily showing a battery diagnosis method according to a first embodiment of the present disclosure.

Referring to FIGS. 1 to 3, in step S310, the control unit 140 measures the cell voltage of each of the first to $n^{th}$ battery cells $BC_1 \sim BC_n$ a first number of times for the first rest period. The first rest period may be from a first time point to a second time point. The first time point may be a time point at which the battery pack 10 is changed from the cycle state to the rest state (see the time point to in FIG. 2). The second time point may be a time point at which a first voltage sensing time has passed since the first time point. During the first rest period, the cell voltage of each of the first to $n^{th}$ battery cells $BC_1 \sim BC_n$ may be measured at a first time interval (for example, 1 sec). The first number of times is preset to be two or more to remove the inaccuracy of the method of measuring the cell voltage only once. Accordingly, the first voltage sensing time may be preset to be equal to or larger than the multiplication of the first time interval by the first number of times.

In step S320, the control unit 140 determines first to $n^{th}$ average cell voltages for the first rest period based on the cell voltage of each of the first to $n^{th}$ battery cells $BC_1 \sim BC_n$ measured the first number of times for the first rest period. The first to $n^{th}$ average cell voltages for the first rest period are associated with the first to $n^{th}$ battery cells $BC_1 \sim BC_n$ in a one-to-one relationship. The control unit 140 may determine the first to $n^{th}$ average cell voltages for the first rest period using the following Equation 1.

$$V_{k\_1} = \frac{1}{i} \times \sum_{x=1}^{i} V_k[x] \qquad \langle \text{Equation 1} \rangle$$

In Equation 1, k denotes the natural number that is equal to or less than n, i denotes the first number of times, x denotes the natural number that is equal to or less than i, $V_k[x]$ denotes the cell voltage of the $k^{th}$ battery cell $BC_k$ measured at the $x^{th}$ time within the first rest period, and $V_{k\_1}$ denotes the average cell voltage of the $k^{th}$ battery cell $BC_k$ for the first rest period.

In step S330, the control unit 140 determines a first reference voltage based on the first to $n^{th}$ average cell voltages for the first rest period. The first reference voltage may be the mean, median, minimum or maximum of the first to $n^{th}$ average cell voltages for the first rest period.

In step S340, the control unit 140 measures the cell voltage of each of the first to $n^{th}$ battery cells $BC_1 \sim BC_n$ a second number of times for the second rest period. The second rest period may be from a third time point to a fourth time point. The third time point is later than the second time point, and is a time point at which a threshold time has passed since the first time point. The threshold time may be equal to a predetermined setting time (for example, 3 hours) that is longer than the first voltage sensing time. The fourth time point may be a time point at which a second voltage sensing time has passed since the third time point. During the second rest period, the cell voltage of each of the first to $n^{th}$ battery cells $BC_1 \sim BC_n$ may be measured at a second time interval. The second time interval may be equal to the first time interval. The second number of times is preset to be two or more to remove the inaccuracy of the method of measuring the cell voltage only once. Accordingly, the second voltage sensing time may be preset to be equal to or larger than the multiplication of the second time interval by the second number of times.

In step S350, the control unit 140 determines first to $n^{th}$ average cell voltages for the second rest period based on the cell voltage of each of the first to $n^{th}$ battery cells $BC_1 \sim BC_n$ measured the second number of times for the second rest period. The first to $n^{th}$ average cell voltages for the second rest period are associated with the first to $n^{th}$ battery cells $BC_1 \sim BC_n$ in a one-to-one relationship. The control unit 140 may determine the first to $n^{th}$ average cell voltages for the second rest period using the following Equation 2.

$$V_{k\_2} = \frac{1}{j} \times \sum_{y=1}^{j} V_k[y] \qquad \langle \text{Equation 2} \rangle$$

In Equation 2, k denotes the natural number that is equal to or less than n, j denotes the second number of times, y denotes the natural number that is equal to or less than j, $V_k[y]$ denotes the cell voltage of the $k^{th}$ battery cell $BC_k$ measured at the $y^{th}$ time within the second rest period, and $V_{k\_2}$ denotes the $k^{th}$ average cell voltage for the second rest period. The second number of times may be equal to the first number of times.

In step S360, the control unit 140 determines a second reference voltage based on the first to $n^{th}$ average cell voltages for the second rest period. The second reference voltage may be the mean, median, minimum or maximum of the first to $n^{th}$ average cell voltages for the second rest period.

In step S370, the control unit 140 determines first to $n^{th}$ reference values associated with the first to $n^{th}$ battery cells $BC_1 \sim BC_n$ in a one-to-one relationship. That is, the $k^{th}$ reference value is associated with the k' battery cell $BC_k$. Each reference value may be determined using the following Equation 3.

$$R_k = \frac{V_{k\_1} - V_{k\_2}}{V_{ref\_1} - V_{ref\_2}} \qquad \langle \text{Equation 3} \rangle$$

In Equation 3, k denotes the natural number that is equal to or less than n, $V_{ref\_1}$ denotes the first reference voltage, $V_{ref\_2}$ denotes the second reference voltage, and $R_k$ denotes the $k^{th}$ reference value. When the $k^{th}$ battery cell $BC_k$ is in a normal condition, a difference between the $k^{th}$ average cell voltage $V_{k\_1}$ for the first rest period and the $k^{th}$ average cell voltage $V_{k\_2}$ for the second rest period will be very small, so $R_k$ will be also very small. In contrast, when the $k^{th}$ battery cell $BC_k$ is in a faulty condition, the $k^{th}$ average cell voltage $V_{k\_2}$ for the second rest period will significantly reduce from the $k^{th}$ average cell voltage $V_{k\_1}$ for the first rest period, so the $k^{th}$ reference value $R_k$ will be very large.

Alternatively, the control unit 140 may determine the $k^{th}$ reference value using the following Equation 4 instead of Equation 3.

$$R_k = \frac{V_{ref\_2} - V_{k\_2}}{V_{ref\_1} - V_{k\_1}} \quad \langle \text{Equation 4} \rangle$$

In step S380, the control unit 140 determines whether the $k^{th}$ reference value is equal to or larger than a predetermined threshold diagnosis value that is larger than 1. When a value of the step S380 is "Yes", step S390 is performed. When the value of the step S380 is "No", the method may end.

In step S390, the control unit 140 executes a safety operation. The safety operation may be the generation of an OFF and/or fault signal of the switch 20. The fault signal may be transmitted to the high level controller 2 through the communication unit 150.

FIG. 4 is a flowchart exemplarily showing a battery diagnosis method according to a second embodiment of the present disclosure. In the description of the second embodiment, descriptions in common with the first embodiment are omitted herein to avoid redundancy.

Referring to FIGS. 1, 2 and 4, in step S400, the control unit 140 determines an average maximum capacity of the first to $n^{th}$ battery cells $BC_1 \sim BC_n$. The average maximum capacity is the result of dividing the sum of maximum capacity of the first to $n^{th}$ battery cells $BC_1 \sim BC_n$ by n.

In step S402, the control unit 140 determines a threshold time based on the average maximum capacity. The control unit 140 may reduce the threshold time as the average maximum capacity reduces. The control unit 140 may determine the threshold time using the following Equation 5.

$$\Delta t_{th} = \Delta t_{set} \times \frac{Q_{av}}{Q_{design}} \quad \langle \text{Equation 5} \rangle$$

In Equation 5, $Q_{av}$ denotes the average maximum capacity, $Q_{design}$ denotes a predetermined reference capacity, $\Delta t_{set}$ denotes the predetermined setting time, and $\Delta t_{th}$ denotes the threshold time.

In step S410, the control unit 140 measures the cell voltage of each of the first to $n^{th}$ battery cells the first number of times for the first rest period. The first rest period may be from the first time point to the second time point.

In step S420, the control unit 140 determines first to $n^{th}$ average cell voltages for the first rest period based on the cell voltage of each of the first to $n^{th}$ battery cells $BC_1 \sim BC_n$ measured the first number of times for the first rest period (see Equation 1).

In step S430, the control unit 140 determines a first reference voltage based on the first to $n^{th}$ average cell voltages for the first rest period.

In step S440, the control unit 140 measures the cell voltage of each of the first to $n^{th}$ battery cells $BC_1 \sim BC_n$ the second number of times for the second rest period. The second rest period may be from the third time point to the fourth time point. The third time point may be a time point at which the threshold time determined in the step S402 has passed since the first time point.

In step S450, the control unit 140 determines first to $n^{th}$ average cell voltages for the second rest period based on the cell voltage of each of the first to $n^{th}$ battery cells $BC_1 \sim BC_n$ measured the second number of times for the second rest period (see Equation 2).

In step S460, the control unit 140 determines a second reference voltage based on the first to $n^{th}$ average cell voltages for the second rest period.

In step S470, the control unit 140 determines first to $n^{th}$ reference values associated with the first to $n^{th}$ battery cells $BC_1 \sim BC_n$ in a one-to-one relationship (see Equation 3 or 4).

In step S480, the control unit 140 determines whether the $k^{th}$ reference value is equal to or larger than a predetermined threshold diagnosis value that is larger than 1. When a value of the step S480 is "Yes", step S490 is performed. When the value of the step S480 is "No", the method may end.

In step S490, the control unit 140 executes a safety operation. The safety operation may be the generation of an OFF and/or fault signal of the switch 20. The fault signal may be transmitted to the high level controller 2 through the communication unit 150.

FIG. 5 is a flowchart exemplarily showing a battery diagnosis method according to a third embodiment of the present disclosure. In the description of the third embodiment, descriptions in common with the first and second embodiments are omitted herein to avoid redundancy.

Referring to FIGS. 1, 2 and 5, in step S500, the control unit 140 determines first to $n^{th}$ diagnosis values based on the maximum capacity of the first to $n^{th}$ battery cells $BC_1 \sim BC_n$ respectively. The control unit 140 may increase the $k^{th}$ diagnosis value as the maximum capacity of the $k^{th}$ battery cell $BC_k$ reduces. The control unit 140 may determine each diagnosis value using the following Equation 6.

$$D_k = D_{set} \times \frac{Q_{design}}{Q_k} \quad \langle \text{Equation 6} \rangle$$

In Equation 6, k denotes the natural number that is equal to or less than n, $Q_k$ denotes the maximum capacity of the $k^{th}$ battery cell $BC_k$, $Q_{design}$ denotes a predetermined reference capacity, $D_{set}$ denotes the predetermined threshold diagnosis value, and $D_k$ denotes the $k^{th}$ diagnosis value.

In step S510, the control unit 140 measures the cell voltage of each of the first to $n^{th}$ battery cells $BC_1 \sim BC_n$ the first number of times for the first rest period. The first rest period may be from the first time point to the second time point.

In step S520, the control unit 140 determines first to $n^{th}$ average cell voltages for the first rest period respectively based on the cell voltage of the first to $n^{th}$ battery cells $BC_1 \sim BC_n$ measured the first number of times for the first rest period (see Equation 1).

In step S530, the control unit 140 determines a first reference voltage from the first to $n^{th}$ average cell voltages for the first rest period.

In step S540, the control unit 140 measures the cell voltage of each of the first to $n^{th}$ battery cells $BC_1 \sim BC_n$ the second number of times for the second rest period. The second rest period may be from the third time point to the fourth time point. The third time point is later than the second time point, and is a time point at which the threshold time has passed since the first time point. The threshold time may be equal to the predetermined setting time (for example, 3 hours).

In step S550, the control unit 140 determines first to $n^{th}$ average cell voltages for the second rest period respectively based on the cell voltage of the first to $n^{th}$ battery cells $BC_1 \sim BC_n$ measured the second number of times for the second rest period (see Equation 2).

In step S560, the control unit 140 determines a second reference voltage from the first to $n^{th}$ average cell voltages for the second rest period.

In step S570, the control unit 140 determines first to $n^{th}$ reference values associated with the first to $n^{th}$ battery cells $BC_1 \sim BC_n$ in a one-to-one relationship (see Equation 3 or 4).

In step S580, the control unit 140 determines whether the $k^{th}$ reference value is equal to or larger than the $k^{th}$ diagnosis value. When a value of the step S580 is "Yes", step S590 is performed. When the value of the step S580 is "No", the method may end.

In step S590, the control unit 140 executes a safety operation. The safety operation may be the generation of an OFF and/or fault signal of the switch 20. The fault signal may be transmitted to the high level controller 2 through the communication unit 150.

The high level controller 2 may output information notifying the fault of the $k^{th}$ battery cell $BC_k$ to a manager in response to the fault signal.

The embodiments of the present disclosure described hereinabove are not implemented only through the apparatus and method, and may be implemented through programs that realize the functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that a variety of modifications and changes may be made within the technical aspect of the present disclosure and the equivalent scope of the appended claims.

Additionally, as many substitutions, modifications and changes may be made to the present disclosure by those skilled in the art without departing from the technical aspects of the present disclosure, the present disclosure is not limited by the foregoing embodiments and the accompanying drawings, and some or all of the embodiments may be selectively combined to make various modifications to the present disclosure.

What is claimed is:

1. A battery diagnosis apparatus, comprising:
a voltage measurer configured to measure a cell voltage of each of first to $n^{th}$ battery cells of a battery, wherein n is a natural number of 2 or greater; and
a processor operably coupled to the voltage measurer and to a switch of the battery,
wherein the processor is configured to:
determine first to $n^{th}$ average cell voltages for a first rest period associated with the first to $n^{th}$ battery cells in a one-to-one relationship, based on the cell voltage of each battery cell measured a first number of times for the first rest period, wherein the first rest period is from a first time point to a second time point,
determine first to $n^{th}$ average cell voltages for a second rest period associated with the first to $n^{th}$ battery cells in a one-to-one relationship, based on the cell voltage of each battery cell measured a second number of times for the second rest period, wherein the second rest period is from a third time point to a fourth time point, and the third time point is later than the second time point, and is a time point at which a threshold time has passed since the first time point,
diagnose a fault of each of the first to $n^{th}$ battery cells based on the first to $n^{th}$ average cell voltages for the first rest period and the first to $n^{th}$ average cell voltages for the second rest period, and
execute a safety operation of controlling the switch of the battery to an OFF state, in response to diagnosing the fault.

2. The battery diagnosis apparatus according to claim 1, wherein the first time point is a time point at which the first to $n^{th}$ battery cells is changed from a cycle state to a rest state.

3. The battery diagnosis apparatus according to claim 1, wherein the processor is configured to determine the first to $n^{th}$ average cell voltages for the first rest period using the following Equation 1:

$$V_{k\_1} = \frac{1}{i} \times \sum_{x=1}^{i} V_k[x] \qquad \text{<Equation 1>}$$

wherein k is a natural number that is equal to or less than n, i is the first number of times, x is a natural number that is equal to or less than i, $V_k[x]$ is the cell voltage of the $k^{th}$ battery cell measured at the $x^{th}$ time within the first rest period, and $V_{k\_1}$ is the $k^{th}$ average cell voltage for the first rest period.

4. The battery diagnosis apparatus according to claim 3, wherein the processor is configured to determine the first to $n^{th}$ average cell voltages for the second rest period using the following Equation 2:

$$V_{k\_2} = \frac{1}{j} \times \sum_{y=1}^{j} V_k[y] \qquad \text{<Equation 2>}$$

wherein k is a natural number that is equal to or less than n, j is the second number of times, y is a natural number that is equal to or less than j, $V_k[y]$ is the cell voltage of the $k^{th}$ battery cell measured at the $y^{th}$ time within the second rest period, and $V_{k\_2}$ is the $k^{th}$ average cell voltage for the second rest period.

5. The battery diagnosis apparatus according to claim 4, wherein the processor is configured to:
determine a first reference voltage based on the first to $n^{th}$ average cell voltages for the first rest period, and
determine a second reference voltage based on the first to $n^{th}$ average cell voltages for the second rest period.

6. The battery diagnosis apparatus according to claim 5, wherein the processor is configured to determine first to $n^{th}$ reference values associated with the first to $n^{th}$ battery cells in a one-to-one relationship, using the following Equation 3:

$$R_k = \frac{V_{k\_1} - V_{k\_2}}{V_{ref\_1} - V_{ref\_2}} \qquad \text{<Equation 3>}$$

wherein k is a natural number that is equal to or less than n, $V_{ref\_1}$ is the first reference voltage, $V_{ref\_2}$ is the second reference voltage, and $R_k$ is the $k^{th}$ reference value.

7. The battery diagnosis apparatus according to claim 6, wherein the processor is configured to diagnose that the $k^{th}$ battery cell is faulty when the $k^{th}$ reference value is equal to or larger than a predetermined threshold diagnosis value that is larger than 1.

8. The battery diagnosis apparatus according to claim 6, wherein the processor is configured to:
   determine first to $n^{th}$ diagnosis values based on the maximum capacity of each of the first to $n^{th}$ battery cells, each diagnosis value being larger than 1, and
   diagnose that the $k^{th}$ battery cell is faulty when the $k^{th}$ reference value is equal to or larger than the $k^{th}$ diagnosis value.

9. The battery diagnosis apparatus according to claim 8, wherein the processor is configured to increase the $k^{th}$ diagnosis value as the maximum capacity of the $k^{th}$ battery cell reduces.

10. The battery diagnosis apparatus according to claim 5, wherein the processor is configured to determine first to $n^{th}$ reference values associated with the first to $n^{th}$ battery cells in a one-to-one relationship, using the following Equation 4:

$$R_k = \frac{V_{ref\_2} - V_{k\_2}}{V_{ref\_1} - V_{k\_1}} \qquad \text{<Equation 4>}$$

wherein k is a natural number that is equal to or less than n, $V_{ref\_1}$ is the first reference voltage, $V_{ref\_2}$ is the second reference voltage, and $R_k$ is the $k^{th}$ reference value.

11. The battery diagnosis apparatus according to claim 1, wherein the processor is configured to determine the threshold time based on an average maximum capacity of the first to $n^{th}$ battery cells.

12. The battery diagnosis apparatus according to claim 11, wherein the processor is configured to reduce the threshold time as the average maximum capacity reduces.

13. An energy storage system comprising the battery diagnosis apparatus according to claim 1.

14. A battery diagnosis method that is executable by the battery diagnosis apparatus according to claim 1, the battery diagnosis method comprising:
   determining, via the processor, first to $n^{th}$ average cell voltages for a first rest period associated with first to $n^{th}$ battery cells of a battery in a one-to-one relationship, respectively based on cell voltages of the first to $n^{th}$ battery cells measured a first number of times for the first rest period, wherein the first rest period is from a first time point to a second time point, and n is a natural number of 2 or greater;
   determining, via the processor, first to $n^{th}$ average cell voltages for a second rest period associated with the first to $n^{th}$ battery cells in a one-to-one relationship, based on a cell voltage of each battery cell measured a second number of times for the second rest period, wherein the second rest period is from a third time point to a fourth time point, and the third time point is later than the second time point and is a time point at which a threshold time has passed since the first time point;
   diagnosing, via the processor, a fault of each of the first to $n^{th}$ battery cells based on the first to $n^{th}$ average cell voltages for the first rest period and the first to $n^{th}$ average cell voltages for the second rest period; and
   executing, via the processor, a safety operation of controlling a switch of the battery to an OFF state, in response to diagnosing the fault.

* * * * *